United States Patent
Ammerl

(10) Patent No.: US 10,431,486 B2
(45) Date of Patent: Oct. 1, 2019

(54) WAFER ALIGNING DEVICE AND METHOD FOR ALIGNING A WAFER INTO A SPECIFIED ROTATIONAL ANGULAR POSITION

(71) Applicant: MUETEC AUTOMATISIERTE MIKROSKOPIE UND MESSTECHNIK GMBH, Munich (DE)

(72) Inventor: Josef Ammerl, Obernzell-Haar (DE)

(73) Assignee: MUETEC AUTOMOTIVE MIKROSKOPIE UND MESSTECHNIK GMBH, München (DE)

( * ) Notice: Subject to any disclaimer, the term of this patent is extended or adjusted under 35 U.S.C. 154(b) by 23 days.

(21) Appl. No.: 15/508,214

(22) PCT Filed: Sep. 4, 2015

(86) PCT No.: PCT/EP2015/001787
§ 371 (c)(1),
(2) Date: Mar. 2, 2017

(87) PCT Pub. No.: WO2016/034289
PCT Pub. Date: Mar. 10, 2016

(65) Prior Publication Data
US 2017/0287763 A1    Oct. 5, 2017

(30) Foreign Application Priority Data

Sep. 5, 2014   (DE) .................. 10 2014 013 188

(51) Int. Cl.
*H01L 21/68*    (2006.01)
*H01L 21/67*    (2006.01)
(Continued)

(52) U.S. Cl.
CPC ...... *H01L 21/681* (2013.01); *H01L 21/67259* (2013.01); *H01L 21/67766* (2013.01); *H01L 21/68785* (2013.01)

(58) Field of Classification Search
CPC ............. H01L 21/681; H01L 21/67259; H01L 21/67766; H01L 21/68785
(Continued)

(56) References Cited

U.S. PATENT DOCUMENTS 4,775,281 A * 10/1988 Prentakis ............... B23Q 7/048
                                                                118/500
5,626,456 A *  5/1997 Nishi ................. H01L 21/67781
                                                                414/331.14
(Continued)

FOREIGN PATENT DOCUMENTS

DE       19925653       1/2000
DE     102009026187     1/2011
(Continued)

OTHER PUBLICATIONS

Official Action, dated May 18, 2015, of German patent application DE 10 2014 013 188.2.
(Continued)

*Primary Examiner* — Ronald P Jarrett
(74) *Attorney, Agent, or Firm* — Michael Stanley Tomsa; McAndrews, Held & Malloy, Ltd.

(57) ABSTRACT

The invention relates to wafer aligning device (1) and a corresponding method for aligning a wafer (2) into a specified rotational angular position ($a_s$), having a wafer table (20) with a table receiving area (30) for receiving the wafer (2) on a table receiving area plane (T) and having an aligning means (40) with an aligning receiving area (50) which is designed to align the wafer (2) into a specified rotational angular position. The aligning receiving area (50) is
(Continued)

arranged in an aligning position ($P_A$) above the table receiving area plane (T) of the wafer table (20) when receiving the wafer (2), and at least one of the aligning receiving area (50) and the table receiving area (30) is designed to place a wafer (2) received in the aligning receiving area (50) on the table receiving area (30) upon traversing the aligning receiving area (50) and the table receiving area plane (T) by means of a vertical movement relative to the other of the aligning receiving area (50) and the table receiving area (30).

15 Claims, 6 Drawing Sheets

(51) Int. Cl.
    *H01L 21/677*  (2006.01)
    *H01L 21/687*  (2006.01)
(58) Field of Classification Search
    USPC .................................................. 414/222.04
    See application file for complete search history.

(56) References Cited

U.S. PATENT DOCUMENTS

| | | |
|---|---|---|
| 6,222,339 B1 | 4/2001 | Yamasaki et al. |
| 6,952,491 B2 | 10/2005 | Alumot et al. |
| 8,817,089 B2 | 8/2014 | Srocka et al. |
| 2002/0039436 A1 | 4/2002 | Alumot et al. |
| 2008/0135788 A1* | 6/2008 | Fogel ............... H01L 21/681 |
| | | 250/559.07 |

FOREIGN PATENT DOCUMENTS

| | | |
|---|---|---|
| WO | 99/45579 | 9/1999 |
| WO | 01/40086 | 6/2001 |

OTHER PUBLICATIONS

International Search Report corresponding to International Patent Application No. PCT/EP2015/001787, dated Dec. 8, 2015.

* cited by examiner

WAFER ALIGNING DEVICE AND METHOD FOR ALIGNING A WAFER INTO A SPECIFIED ROTATIONAL ANGULAR POSITION

CROSS REFERENCE TO RELATED APPLICATIONS

This application is a National Phase Entry of PCT International Application No. PCT/EP2015/001787, which was filed Sep. 4, 2015, and claims priority to German Application No. DE 10 2014 013 188.2, filed Sep. 5, 2014, the entire contents of both of which are herein incorporated by reference.

FIELD

The present invention relates to a wafer aligning device for positioning a wafer in a predetermined rotational angular position, a wafer transport system and a wafer inspection apparatus with such a wafer aligning device as well as a method for aligning the wafer into a predetermined rotational angular position and a method for the transport of a wafer.

BACKGROUND

Wafers are inspected for detecting defective wafers, in particular during and/or after their production. Usually, the inspection is carried out using a scanner which scans the wafers. Inspection devices are known, comprising a scanner, to which a wafer is supplied by means of a transport device, wherein the transport device comprises a wafer carrier—also called a wafer table or chuck —, inside which the wafer to be inspected is placed during inspection.

When inspecting the wafer, the result of the inspection depends with some known methods very much on a rotational angular alignment of the inspected wafer in the wafer carrier. So, in practical applications, the wafers are often supplied to the inspection device aligned by their rotational angle.

However, in some applications such a pre-alignment is not possible or non-economic. In these cases it is known to realise the wafer table in a rotatable version or to supply the wafer from the wafer store to a so-called pre-aligning device which is arranged separately from the inspection device.

German patent application DE 199 25 653 A1 shows a system for controlling the alignment of a semiconductor wafer, wherein the wafer can be taken out of a carrier by means of a wafer transport arm and can be transported to an alignment conversion unit. A rotatable wafer carrier known from German patent application DE 10 2009 026 187 A1 has a complex design and a complex movement inside the inspection device. A pre-aligning device known from US patent application US2002/0039436 A1 has amongst others the disadvantage that the wafer must cover an additional distance from the store to the pre-aligning device and from the pre-aligning device to the wafer table by means of a separate operational device which has in particular a negative effect on the achievable minimum duration of inspection.

DETAILED DESCRIPTION

It is the aim of the invention to provide devices and methods combining a high throughput of wafers with a simplified handling and/or shorter travel distances.

This problem is solved by a wafer aligning device for positioning a wafer in a predetermined rotational angular position with the characteristics of independent claim 1 and a method for aligning a wafer into a predetermined rotational angular position with the characteristics of independent claim 11. A wafer transport system, a wafer inspection apparatus and a method for transporting a wafer as well as preferred embodiments of the invention are object of the dependent claims.

According to an aspect of the invention, a wafer aligning device for positioning a wafer in a predetermined rotational angular position comprises a wafer table with a table receiving area for receiving the wafer in a table receiving area plane and an aligning means with an aligning receiving area adapted for aligning the wafer into a predetermined rotational angular position. During reception of the wafer, the aligning receiving area is arranged in an aligning position above the table receiving area plane of the wafer table. At least one of the aligning receiving area and the table receiving area is adapted for positioning a wafer received in the aligning receiving area by a vertical relative movement in relation to the other of the aligning receiving area and the table receiving area on the table receiving area when traversing the aligning receiving area and the table receiving area plane.

So the travel distance of the wafer between the aligning means and the wafer table can be reduced in an advantageous manner. Likewise, an advantageous kinematic separation of the aligning mechanism and the wafer table can thereby be achieved.

In a preferred embodiment, the wafer can, after alignment, be positioned on the table receiving area by lowering the aligning receiving area.

A table receiving area for receiving the wafer can here be adapted with at least one, in particular two or three table receiving area elements, wherein the table receiving area elements preferably comprise at least one even support surface for receiving one of the two planar surfaces of the wafer.

Within the scope of the invention a table receiving area plane can in particular be a horizontal plane where the support surface of at least one, in particular of all table receiving area elements is arranged. Preferably, the table receiving area plane is arranged within the vertical extension (in the z-direction) of the wafer table. However, the table receiving area plane can also be arranged above or below the latter or it can be mobile.

In different embodiments within the scope of the invention, the wafer table comprises at least one metallic material, in particular a steel and/or aluminum material, ceramic material and/or plastic material or consists of such a material or a combination, compounds or an alloy of at least two such materials.

A rotational angular position of a wafer can be understood here as the alignment of predetermined, in particular frequently occurring edge and/or surface features of the wafer, in relation to the wafer table. A predetermined rotational angular position is preferably to be understood as the rotational angular position of a wafer which is defined as desired and/or required in the sense of a succeeding inspection process of the wafer, in particular a surface inspection of the wafer.

The aligning position of the aligning receiving area is preferably also defined by the z-position, in which the wafer is received in the aligning receiving area during its rotational angular alignment.

For a vertical relative movement of the aligning receiving area and the table receiving area in relation to one another, it is possible that only the aligning receiving area moves vertically downwards, that only the table receiving area moves vertically upwards or that the aligning receiving area moves downwards and the table receiving area moves upwards. By traversing the aligning receiving area and the table receiving area it is meant in particular that there is a change as to which of the two components has a higher position in relation to the z-direction.

According to a preferred embodiment, the wafer table of the wafer aligning device comprises a recess through which the aligning receiving area can be displaced vertically and has a limit which is at least partially designed as at least one table receiving area element.

In this advantageous manner, little installation space is required for the wafer aligning device. In a similar advantageous way, gravity can be used when positioning the wafer on a table receiving area element.

A recess of the wafer table can, according to the present invention, be adapted as a partially or completely limited excavation of material from the wafer table. Preferably form and dimension of the recess are such that the aligning receiving area can be displaced vertically through the recess without any adjusting movement (such as tilting and/or pivoting) and/or such that when the wafer is placed on the table receiving area, it can be received inside the recess in relation to the z-direction up to a part of the limit designed as a table receiving area element.

According to a preferred embodiment, when the wafer is positioned on the table receiving area, at least one table receiving area element radially engages a vertical projection of the wafer surface.

Thereby the design of the wafer aligning device and in particular of the wafer table can be simplified, in particular by avoiding a separate mounting of table receiving area elements.

In the present invention, a vertical projection 5 of the wafer surface 3 is in particular to be understood as a projection of the cross-section of the wafer at one of its planar surfaces in a direction orthogonal to the latter (here z-direction), presenting an infinite cylinder which is parallel to a z-direction. When the wafer is moved in the z-direction along this projection, it is preferably positioned on this table receiving area element at the z-position where a table receiving area element is in radial engagement.

According to a preferred embodiment the wafer aligning device additionally comprises an aligning sensor device for detecting a rotational angular position of the wafer during positioning in the aligning receiving area. The aligning sensor device comprises at least one camera and/or a light curtain for optical detection of surface and/or edge features of the wafer.

The aligning receiving area is adapted for rotary alignment of the wafer depending on a difference between the detected rotational angular position and the predetermined rotational angular position recognized by the aligning sensor device.

It is clear that the wafer aligning device comprises a control device for evaluating sensor data and/or for controlling different operations of the wafer aligning device, in particular on the basis of sensor data collected by the aligning sensor device.

By detecting surface and/or edge features of the wafer, similar features on the surface or at an edge of all wafers can in an advantageous manner be used for facilitating a real (actual) rotational angular position of the wafer and thereby a targeted alignment into a predetermined rotational angular position by means of the aligning receiving area.

According to a further aspect of the invention, a wafer transport system for the transport of a wafer, in particular towards an inspection position of a wafer inspection apparatus, comprises a wafer aligning device according to an embodiment of the invention as well as an extraction means with an extraction receiving area for the transport of the wafer from a storage site in a wafer store to the aligning receiving area. Prior to a transfer of the wafer, the extraction receiving area is arranged in a transfer position above the aligning receiving area. Thereby, at least one of the aligning receiving area and the extraction receiving area is adapted for positioning a wafer received in the extraction receiving area on the aligning receiving area by a vertical relative movement in relation to the other of aligning receiving area and extraction receiving area during a reversal of the relative vertical positions of the aligning receiving area and the extraction receiving area in relation to one another. Additionally, at least one of, in particular each of the extraction receiving area and the aligning receiving area is arranged in its resting position below the table receiving plane of the wafer table.

Thereby, the travel distance of the wafer between a wafer store and the aligning receiving means can in an advantageous way be reduced. Similarly, an advantageous kinematic separation of the extraction mechanism, the aligning mechanism and/or the wafer table can be realised, whereby in particular the wafer table can be displaced separately.

According to another preferred embodiment, the wafer table can be displaced in relation to the extraction means and the aligning means during the transport of the wafer towards an inspection position, in particular by means of a transport device of the wafer table. Here, the extraction means and the aligning means are arranged below the table receiving plane, particularly during transport. Hereby, the number of parts to be transported to the inspection position and/or the weight to be transported can be minimized.

According to a preferred embodiment the extraction means of the wafer transport system can, at least with the extraction receiving area, be displaced through the recess in the wafer table. This can allow a compact design of the wafer transport system.

According to another preferred embodiment, a relative position of the wafer in relation to the table recess of the wafer table can be detected by means of the aligning sensor device. Here, the extraction means is, if required, adapted to even out by a translational movement in a first direction, a relative position of the wafer deviating from a predefined value, in particular zero, in this direction. In addition or as an alternative, for evening out a deviating position of the wafer in this direction.

Hereby, precision requirements as to the positioning of the wafers can be reduced during their supply.

According to a preferred embodiment, the wafer table is translationally fixed in a first direction which preferably corresponds to the displacement direction of the extraction means when passing through the aligning sensor device. Additionally, the extraction means is translationally fixed in a second direction which is orthogonal to the first direction and/or the extraction means is translationally fixed in the first and in the second direction.

Due to the separate and/or predetermined allocation of the different degrees of freedom to the different components during transport of the wafer, these can be designed in a simpler way, cheaper, smaller and/or lighter.

According to a further aspect of the invention, a wafer inspection apparatus comprises one, two or more wafer transport systems according to an embodiment of the invention, in particular for achieving an increased and/or multiplied wafer throughput.

The characteristics and advantages described above in the context of preferred embodiments of a wafer aligning device within the scope of the invention are correspondingly also provided in the context of the methods for application described below, and vice versa.

According to a further aspect of the invention, in a method for aligning a wafer into a predetermined rotational angular position, an aligning receiving area of an aligning means is arranged above the table receiving plane of a table receiving area of a wafer table. Furthermore, the wafer is received into the aligning receiving area and is rotationally aligned into a predetermined rotational angular position in the aligning receiving area by means of the aligning means, wherein the alignment can be realised depending on measurement values of an aligning sensor device. Additionally, at least one of aligning receiving area and table receiving area is displaced vertically in relation to the other of aligning receiving area and table receiving area, so that the aligning receiving area and the table receiving plane traverse each other, wherein the wafer is positioned on the table receiving area.

Thereby, the travel distance of the wafer between the aligning means and the wafer table can in an advantageous manner be reduced. Similarly, an advantageous kinematic separation of the aligning mechanism and the wafer table can be achievable.

According to a preferred embodiment, in the method for aligning a wafer, the aligning receiving area is lowered so far below the table receiving area that the aligned wafer is transferred from the aligning receiving area to the table receiving area arranged in the table receiving plane. When the wafer is received by the table receiving area, at least a part of the wafer surface is positioned on at least one table receiving area element, in particular on a part of the border of a recess of the wafer table.

So, in an advantageous manner, little installation space is required for the wafer aligning device. In a similar advantageous way, gravity can be used when positioning the wafer on a table receiving area element.

According to a preferred embodiment, in a method for transporting the wafer, in particular to an inspection position of a wafer inspection apparatus, the wafer is taken from a wafer store by means of an extraction receiving area of an extraction means and is displaced to a position, in particular in the z-direction, above the table receiving area and the aligning receiving area. A vertical relative position of the extraction receiving area and the aligning receiving area to one another is modified so, in particular reversed, that the wafer is received in the aligning receiving area from the extraction receiving area above the table receiving area. According to an embodiment of the invention, the wafer is aligned, received in the table receiving area and displaced to at least one inspection position of the wafer inspection apparatus.

Hereby, the travel distance of the wafer between a wafer store and the aligning means can in an advantageous way be reduced. Similarly, an advantageous kinematic separation of the extracting mechanism, the aligning mechanism and/or the wafer table can be achievable, whereby in particular a separate displacement of the wafer table can be achievable.

According to a preferred embodiment, a position of the wafer taken from the wafer store on the extraction means in relation to a first horizontal direction is determined by means of an aligning sensor device. Depending on the determined position of the wafer in this direction, the extraction means is moved translationally in such a way that the wafer is transferred to the table receiving area at a position in the first direction, predetermined by a guidance of the wafer table in relation to a second direction which is orthogonal to the first direction, in particular via the aligning means.

Thus, the requirements concerning the accuracy of the positioning of the wafers can be reduced during their supply.

According to a preferred embodiment a position of the wafer taken from the wafer store on the extraction means in the second direction is determined by means of an aligning sensor device and, depending on the determined position of the wafer in this direction, the wafer table is moved translationally in such a way that the wafer is transferred to the table receiving area at the position determined in relation to the second direction, in particular via the aligning means.

Thus, the requirements concerning the accuracy of the positioning of the wafers can be reduced during their supply.

According to a preferred embodiment, after the transfer of the wafer to the wafer table, the extraction means and/or the aligning means is/are displaced into its/their respective resting position below the table receiving area plane.

Further preferred embodiments and exemplary embodiments of the invention will in the following be explained in detail, in particular with reference to the figures. These are at least partially schematized and show:

Figure 9:
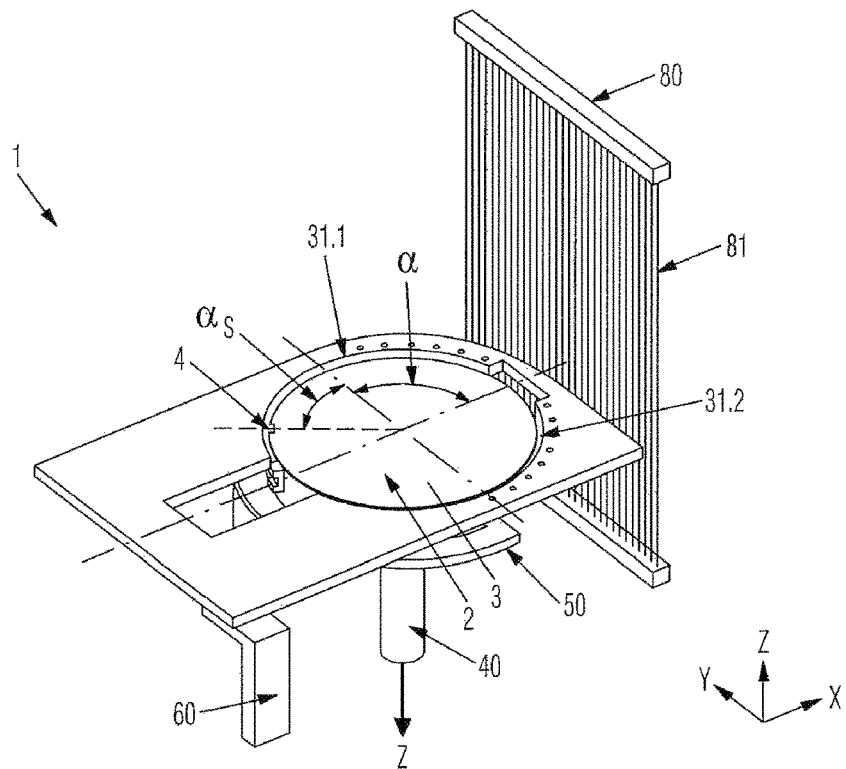
FIG. 9 shows the device in FIG. 1 in a perspective view after positioning the wafer on the table receiving area.
Figure 10:
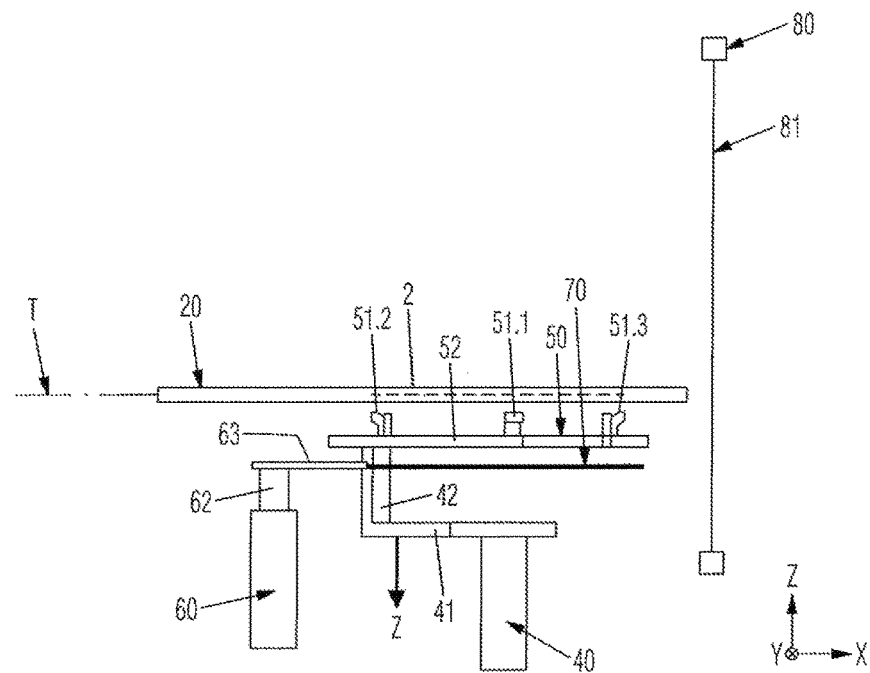
FIG. 10 shows a side view of the device in FIG. 1 in the position shown in FIG. 9.
Figure 11:
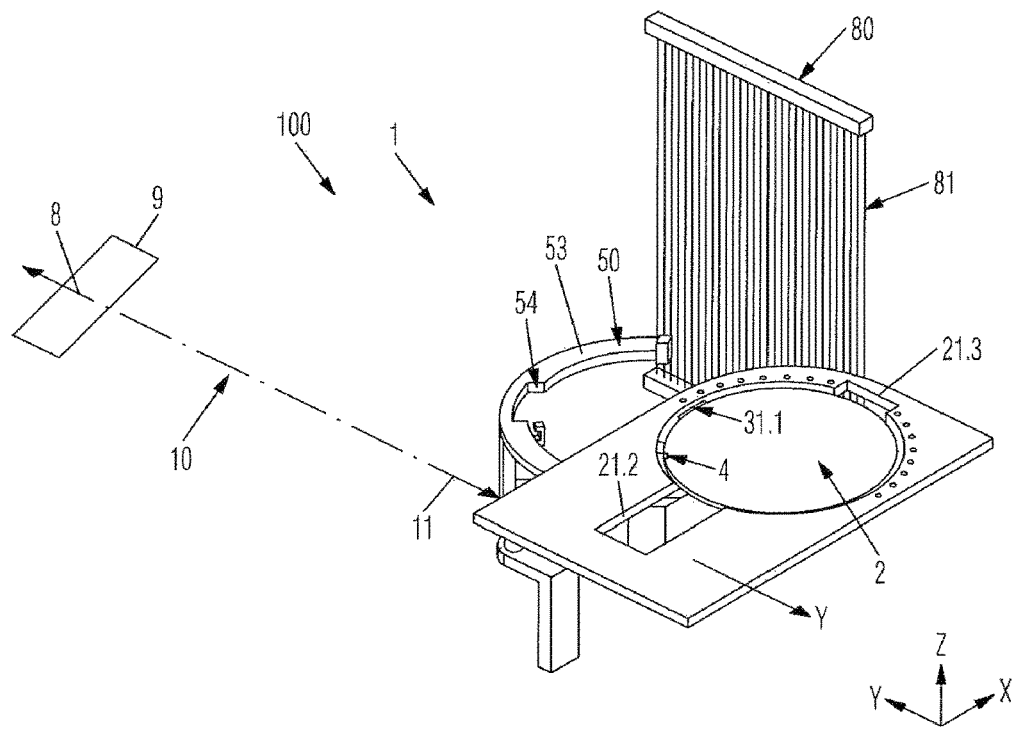
FIG. 11 shows a wafer transport system in a perspective view with a wafer aligning device according to FIG. 1 with a wafer table displaced in the y-direction.

The figures show an exemplary embodiment of a wafer transport system 100, wherein the latter is only shown in FIG. 11, while the views in FIG. 1 to 10 show only components (or their positions) which can be associated to the wafer aligning device 1 of the wafer transport system 100. The wafer aligning device 1 of the exemplary embodiment shown comprises a wafer table 20, an aligning means 40, an extraction means 60 as well as an aligning sensor device 80.

In the present exemplary embodiment, the wafer table 20 is substantially made of an aluminum material. In other exemplary embodiments which are not shown, the wafer table 20 can also be made with or made of a steel material, a ceramic material and/or with a plastic material.

In the exemplary embodiment the table 20 is milled from a metal sheet, wherein the metal sheet has a constant wall thickness of at least two, in particular four millimeters. Preferably, a maximum wall thickness of few, in particular two or three centimeters is provided. In an exemplary embodiment which is not shown, the metal sheet has a variable wall thickness within the above-mentioned limits— adjusted to the stress conditions.

In a further exemplary embodiment which is not shown, the wafer table is not milled from a full material but is designed by sandwiching metal sheets.

The table 20 has a rectangular basic form, wherein for saving material, one or more corners can be rounded. Starting from the upper surface of the table 20, a continuous recess 21 is realised, which in the exemplary embodiment comprises a circumferential limit 22 and serves in particular for receiving the wafer 2 at the table receiving area elements 31 of the table receiving area 30. The recess 21 can also be adapted laterally open in parts, in particular for saving material.

The limit 22 of the recess 21 is specially adapted so that the table receiving area elements 31.1, 31.2 and 31.3 are adapted as a part of said limit 22.

This allows in particular a simple design of the wafer table 20 whose recess 21 is preferably milled from the sheet material, wherein said table receiving area elements 31 can also be formed during this milling process.

The recess 21 is additionally formed so that the extraction means 60 with its extraction receiving area 70 can be displaced in the z-direction via the recess 21. For this purpose, areas 21.2 and 21.3 of the recess 21 are provided, whereas the area 21.1 of the recess 21 is provided for receiving the wafer 2 and for traversing through the receiving areas 30 and/or 70.

The wafer table 20 can be displaced in the y-direction, at least between the position where it receives the wafer and an inspection position 8 (as shown in FIG. 11). For compensating wrong positions of the wafer in the y-direction, the wafer table can also be displaceable beyond the wafer receiving position in the y-direction. When the wafer table is displaced in the y-direction, the extraction means 60 and the aligning means 40 remain in the y-position shown in the figures.

Figure 1:
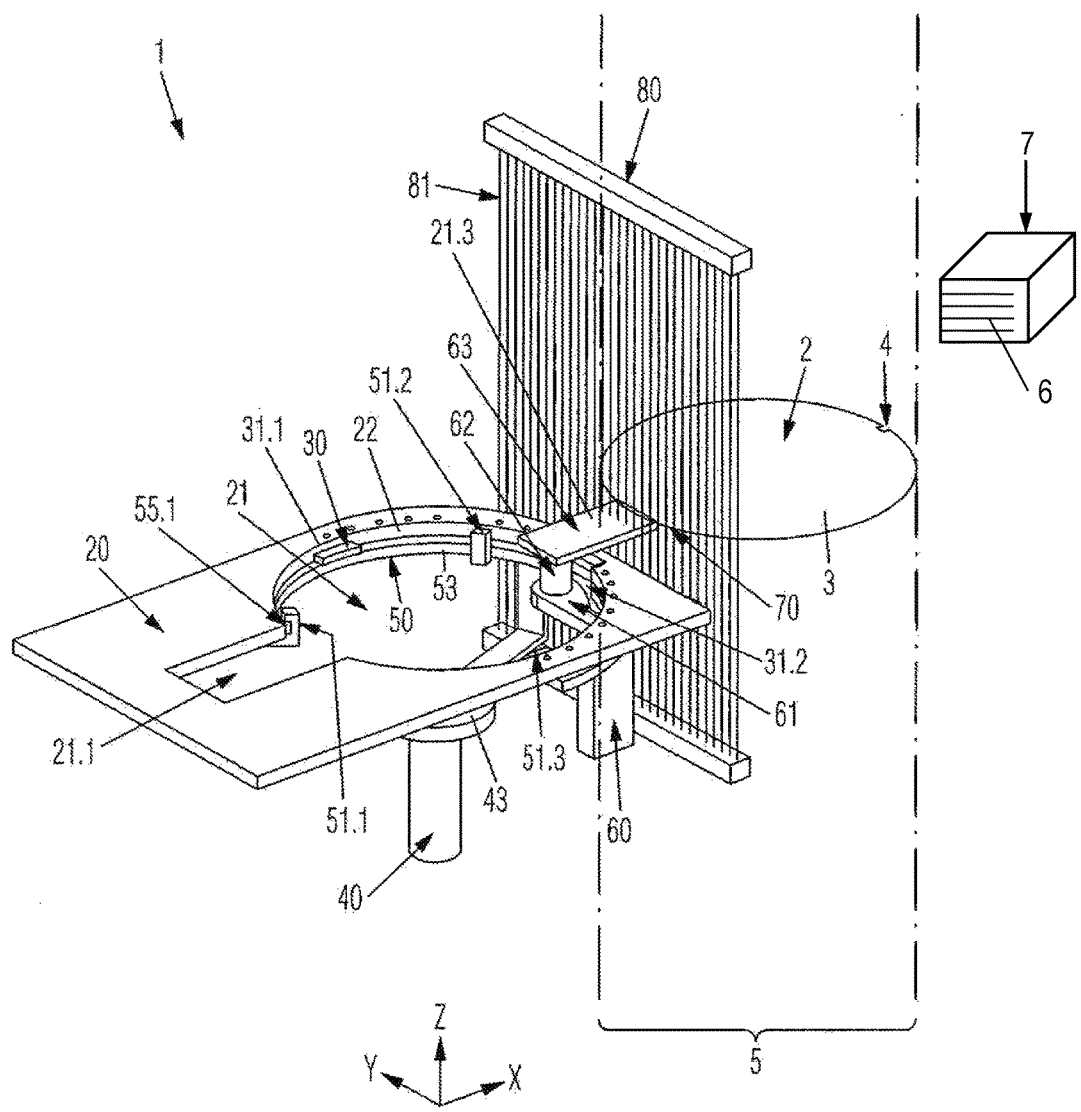
FIG. 1 shows in a perspective view an exemplary embodiment of a wafer aligning device according to the present invention with a wafer taken from the wafer store by means of an extraction means.
Figure 7:
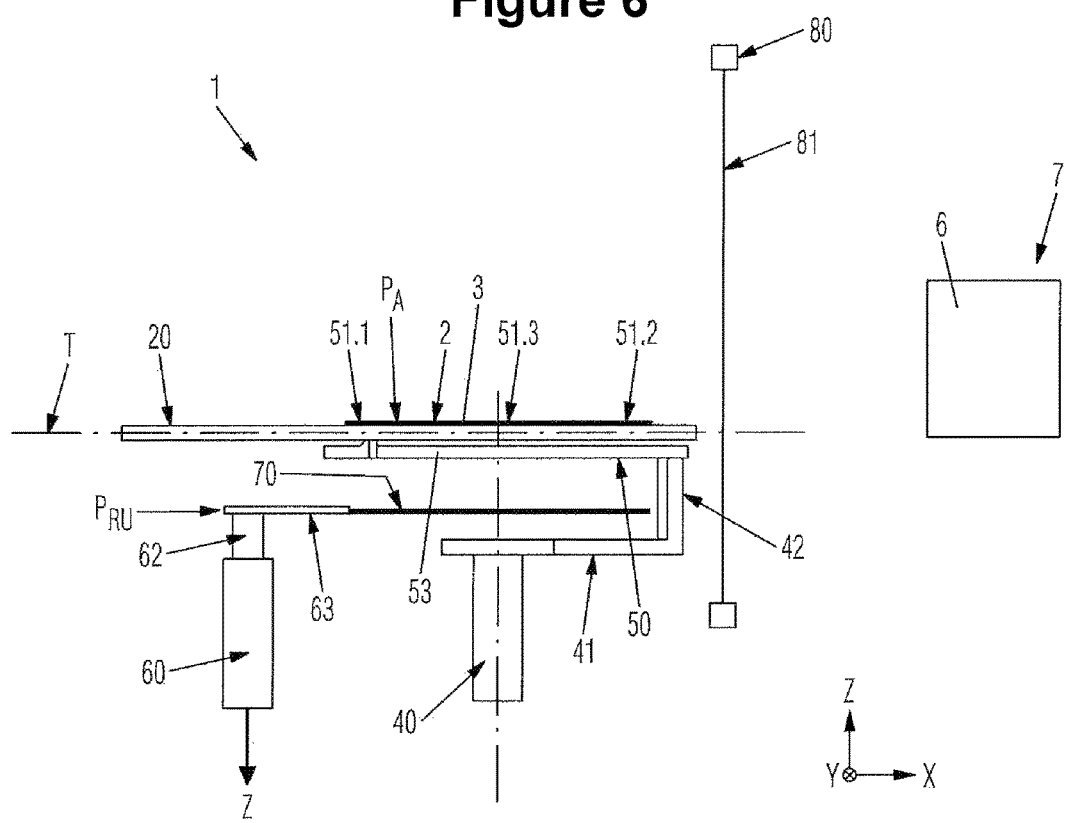
FIG. 7 shows a side view of the device in FIG. 1 in the position shown in FIG. 6.

The extraction means 60 can be displaced translationally in the z-direction and in the x-direction. Because of the displaceability in the x-direction, a wafer 2 can be taken from storage site 6 of a wafer store 7 (as shown in FIGS. 1 and 7) by means of the extraction receiving area 70 and can be displaced to a transfer position PU. In the exemplary embodiment an aligning sensor device 80 with a light curtain 81 is arranged on this displacement path. By means of said light curtain, the surface 3 of the wafer 2 can be checked for the presence and/or the alignment of certain surface features, such as for example conductor tracks, serial numbers, test structures or the like. Similarly, a detection of edge features 4, such as for example the notch 4 realized in the edge of the wafer 2 of the exemplary embodiment, can be realized by means of the light curtain 81.

A rotational angular position $\alpha$ of the wafer 2 taken from the wafer store can be determined on the basis of the presence and/or the alignment of such surfaces and/or edge features 4 by analyzing and evaluating the corresponding measurement values of the aligning sensor device in a control device designed for this purpose.

The required data are collected when the wafer surface 3 is displaced in the x-direction through the light curtain 81 using the extraction means 60.

Instead of a light curtain 81 or in addition to the latter, a camera is provided in an exemplary embodiment (not shown), in particular with image recognition, whose data can be analyzed and evaluated in an analogous way by means of a control device for recognizing features such as the notch 4 or others and for deriving a current rotational angular position $\alpha$ of the wafer 2 on the receiving area 70.

When the extraction means 60 is arranged in such a way in the transfer position $P_U$ that the wafer 2 is arranged exactly above the recess 21.1 and above the aligning receiving area elements 51 extending through the recess 21.1 above the table receiving area plane T of the aligning means 40, the extraction means 60 is displaced downwards in the z-direction. The wafer 2 is then placed on the aligning receiving area elements 51.1, 51.2 and 51.3 with the surface opposite said surface 3.

The x-guidance of the extraction means 60 is arranged offset in the y-direction in relation to the rotary axis of the rotary basis 43 of the aligning means 40, to avoid collision with the aligning means during displacement. For nevertheless allowing a central guidance of the wafer 2 in the x-direction in relation to the table receiving area 30, the extraction means 60 comprises an extraction displacement element 61 which overcomes the described distance in the y-direction. Said extraction displacement element can be in a z-position, which is higher than the highest z-position of a rotary basis 43 of the aligning means 40 that is displaced in the x-direction.

The resting position $P_{RU}$ of the extraction means 60, to which the extraction means 60 is displaced when it is not used, is for example shown in FIG. 7. The resting position $P_{RA}$ to which the aligning means 40 is displaced when it is not used, is not shown in the figures, but it corresponds to the translational z-position in FIG. 10 and to the rotatory z-position in FIG. 1.

When the wafer is taken from the extraction receiving area 70, the aligning means 40 is arranged extending through the recess 21 of the wafer table, so that at least the aligning receiving area elements 51 are situated above the table receiving area plane T which is defined by supporting surfaces of the table receiving area elements 31. When a wafer 2 is placed on these aligning receiving area elements 51, the wafer 2 can be aligned by rotating the aligning means 40 and thus also the aligning recess 21 with the aligning ring 53 comprising said aligning receiving area elements 51. For this purpose, the actual rotational angular position $\alpha$ of the wafer 2 determined by means of sensor data from the aligning sensor device 80 is compared by means of the control device (not shown) to a predetermined rotational angular position $\alpha_S$ and the alignment (i.e. in particular actuated by the control device) is carried out if there is an angular difference between said rotational angular position $\alpha$ and said predetermined rotational angular position $\alpha_S$.

Figure 8:
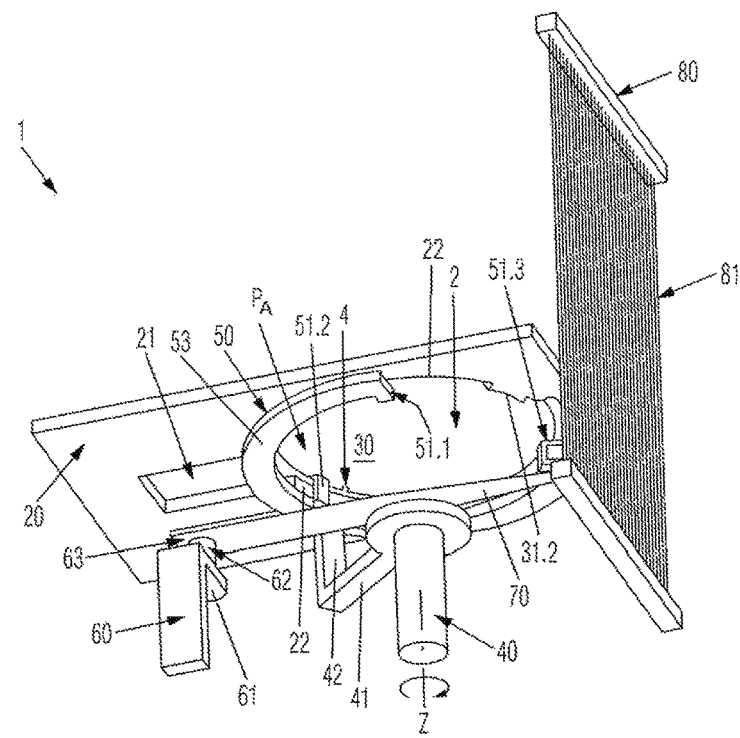
FIG. 8 shows the device in FIG. 1 in a perspective view after aligning the wafer.

During an alignment by means of the aligning means 40, in the exemplary embodiment shown, the extraction means 60 is arranged in its resting position so that a rotation of the aligning means 40 about the z-axis is possible in a very large angular range of approximately 330 degrees. FIG. 7 or FIG. 8 shows for example that the limitation of the angular range of the aligning means 40 results from an otherwise occurring collision between the extraction receiving area 70 and the aligning support 42. Preferably, possible collisions are prevented by a corresponding programming of the control device.

The case of a difference between the actual rotational angular position α and the predetermined rotational angular position $α_S$ which cannot be compensated by a continuous aligning operation which, because of the arrangement of the extraction means 60 and the aligning means 40 in this exemplary embodiment would cause a collision during alignment, can for example be solved by carrying out the alignment in two steps, while temporarily placing the wafer on the table receiving area, by displacing the aligning means with a rotation without the wafer and by then again taking up the wafer with an alignment.

The aligning means 40 comprises a rotary basis 43, to which a horizontal aligning displacement element 41 is attached, at which the vertical aligning support 42 is arranged carrying the aligning receiving area 50 with its aligning ring 53 and the aligning receiving area elements 51.

The aligning receiving area elements 51 are in the exemplary embodiment formed so that they comprise a receiving area 55 in the aligning position (in relation to the z-direction) which is adapted so that during alignment of the wafer and during the corresponding rotational movement a collision with the table receiving area elements 31 is avoided.

When the aligning operation has been finished, the aligning means 40 is displaced vertically downwards in the z-direction, wherein the table receiving area elements 31 take over the wafer 2 on their support surfaces as soon as the aligning receiving area elements 51 traverse the table receiving area plane T in the plane in which they are carrying the wafer. Then, the aligning receiving area 50 and also the aligning means 40 are displaced further into the resting position $P_{RA}$.

The wafer 2 is then positioned in the desired rotational angular position as in the table receiving area 30 of the wafer table 20. The wafer table 20 can then, in particular by means of guidance in the y-direction, be displaced into an inspection position 8 of the wafer inspection apparatus 9, where the wafer 2 can be inspected in the predetermined rotational angular position $α_S$.

FIG. 1 to 11 show different views of operation of steps according to the present invention in an order according to an exemplary method. The latter will in the following be described by way of example.

Figure 2:
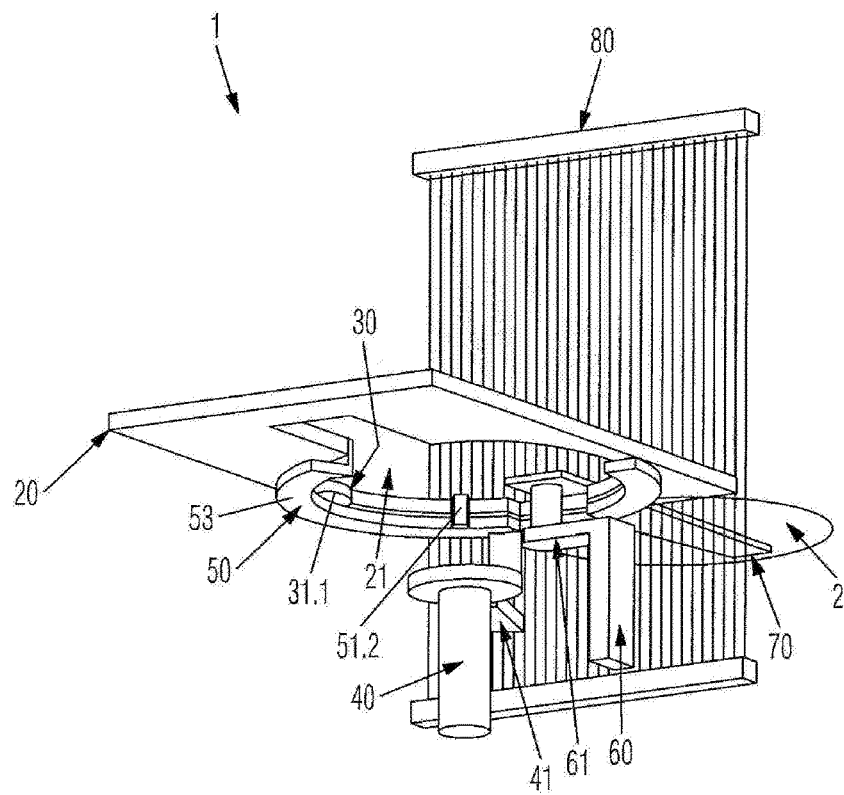
FIG. 2 shows another perspective view of the device in FIG. 1 in the position shown there.

FIGS. 1 and 2 show a wafer 2 which has been taken out of a wafer store (not shown) and has been placed on the extraction receiving area 70 of the extraction means 60.

Figure 3:
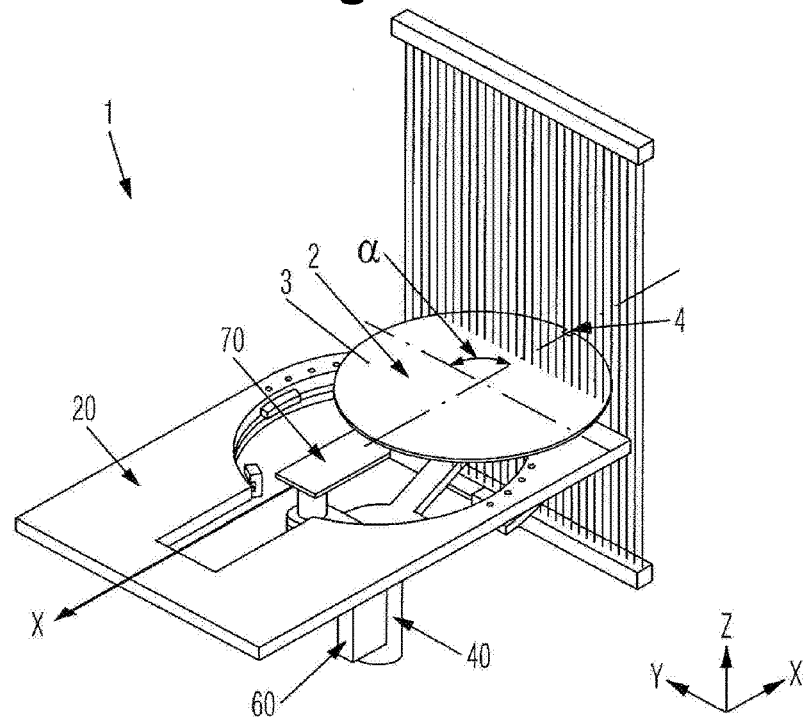
FIG. 3 shows the device in FIG. 1 in a perspective view, wherein the wafer is displaced through the light curtain.

FIG. 3 shows how the wafer 2 is displaced from the extraction receiving area 70 with the extraction means 60 in the x-direction through the light curtain 81. In the exemplary embodiment the position of the notch 4 is determined and the rotational angular position α of the wafer is determined on the basis of this position by means of a control device. Additionally, an x-position and/or a y-position of the wafer on the extraction receiving area can be determined by means of the aligning sensor device. It is thereby possible to compensate for possible deviations from a predetermined position of the wafer on the extraction receiving area 70. Such a compensation can be realised in the x-direction by means of the extraction means 60 which in the case of a detected deviation in the x-direction carries out a displacement plus or minus the value of the deviation in the x-direction until the wafer 2 has reached the desired transfer position $P_U$ corresponding to the deviation (in relation to the x-direction). In the y-direction such a correction can be carried out by displacing the wafer table 20 in the y-direction by the detected deviation in the positive or negative y-direction.

Figure 4:
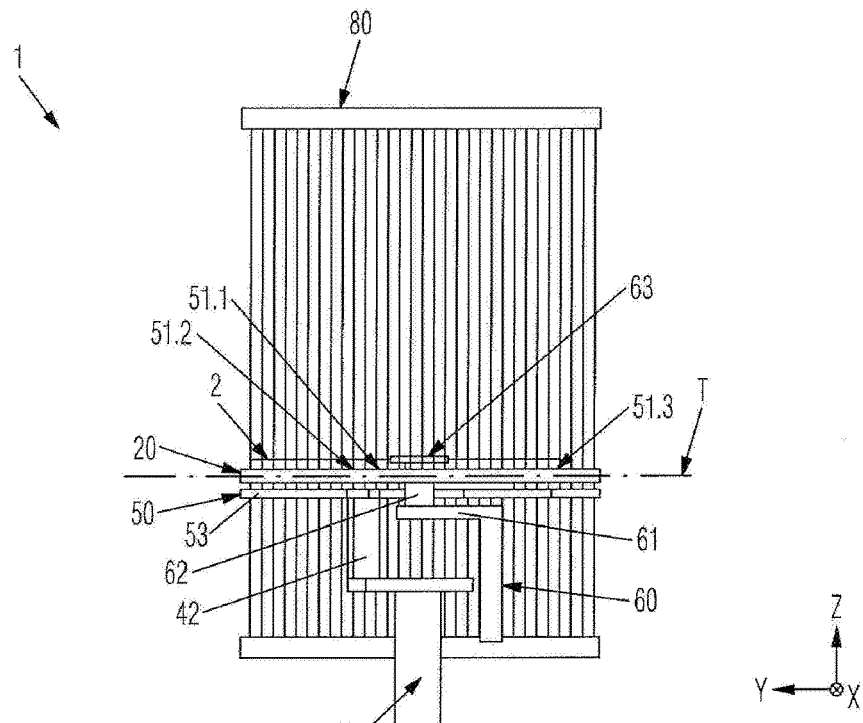
FIG. 4 shows a side view of the device in FIG. 1 in the position shown in FIG. 3.

FIG. 4 shows a side view of the configuration of the wafer aligning device 1 during or shortly after displacement through the light curtain 81. It is obvious that the extraction means 60 with the extraction support 62 and 63 as well as the aligning means 40 with the aligning receiving area elements 51 extend through the recess 21 (not shown in this figure) and intersect or traverse the table receiving area plane T.

FIG. 4 also shows how the extraction means 60 and the aligning means 40 are arranged offset to one another in the y-direction, in particular for avoiding a collision during displacement of the one and/or the other element.

Figure 5:
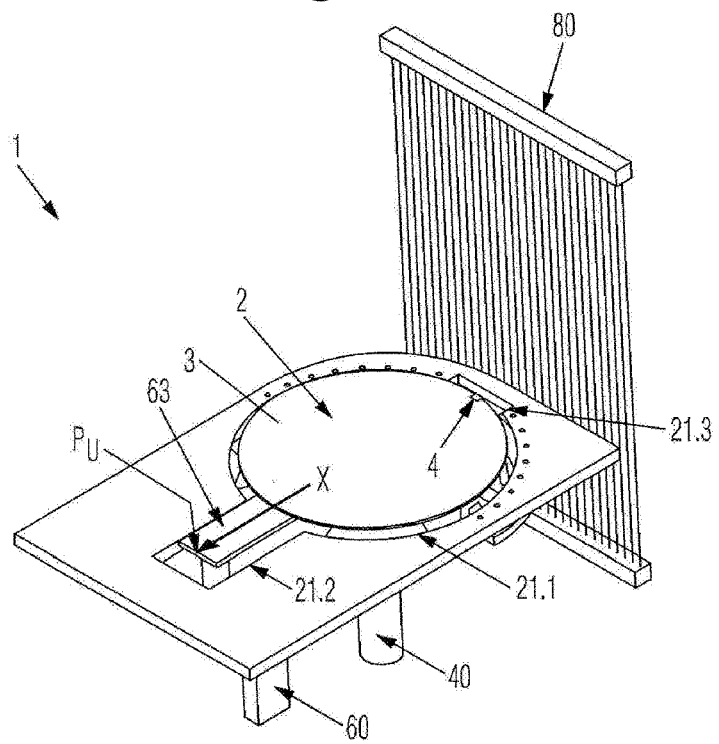
FIG. 5 shows the device in FIG. 1 in a perspective view, wherein the wafer is arranged in a transfer position above the aligning receiving area by means of the extraction means.

In FIG. 5 the extraction means 60 has been displaced so far in the x-direction that the wafer 2 has reached its transfer position $P_U$ where it can be transferred to the aligning receiving area in the z-direction. In FIG. 5, the transfer position $P_U$ is depicted at the horizontal extraction support 63 and can thus eventually comprise possible deviations of the desired wafer position on the extraction receiving area 70 in the x-direction. Although in this figure, the transfer position $P_U$ is depicted at the extraction means 60, the transfer position $P_U$ refers to the position of the wafer 2, as explained in the preceding sentence, here in particular in the x-direction.

Figure 6:
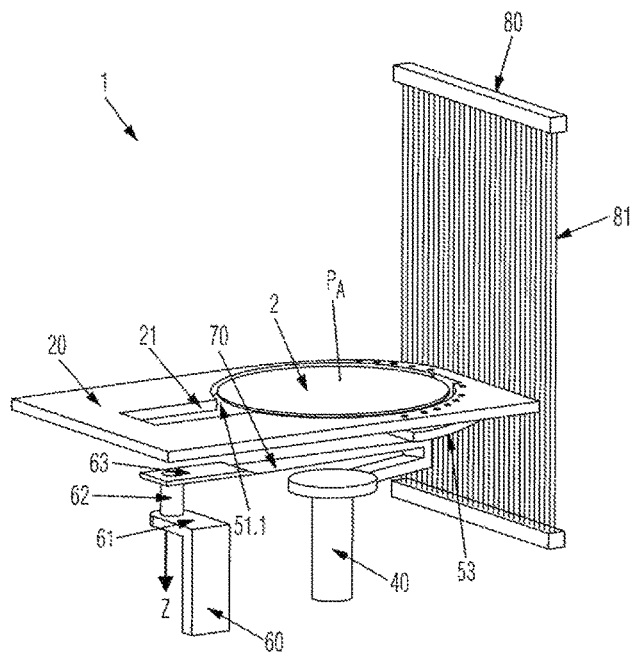
FIG. 6 shows the device in FIG. 1 in a perspective view, wherein the wafer is positioned on the aligning receiving area.

FIG. 6 shows the wafer aligning device 1 after the wafer 2 has been transferred from the extraction receiving area 70 to the aligning receiving area elements 51 of the aligning receiving area 50, by displacing the extraction means 60 downwards in the z-direction, preferably to its resting position $P_{RU}$. The wafer 2 is then taken up in the aligning position $P_A$ in the aligning receiving area 50 in its rotational angular position α.

FIG. 7 shows that the wafer 2 is still arranged above the table receiving area plane T because the support surfaces of the aligning receiving area elements 51 are also arranged above said table receiving area plane T. The extraction means 60 with the extraction receiving area 70 is arranged in its resting position $P_{RU}$ so that an alignment of the wafer 2 can now be carried out by means of the aligning means 40 by a rotation about the z-axis, principally without any collision (rotational degree of freedom of approximately 330 degrees). FIG. 7 shows the aligning support 42, still arranged in its rotational position of origin or resting position.

On the other hand, in the view shown in FIG. 8, the alignment of the wafer 2 into the predetermined rotational angular position $α_S$ has already been realised, as can in particular be seen by the rotational position of the aligning support 42 and by the rotational position of notch 4. The wafer is still in its aligning position $P_A$ (in relation to the translational z-position) which is situated above the table receiving area plane T.

In FIG. 9, the wafer 2 is placed on the table receiving area elements 31.1, 31.2, 31.3 aligned into the predetermined rotational angular position $α_S$. The positioning of the wafer 2 is carried out by a lowering movement of the aligning means 40 in the z-direction, in the course of which the aligning receiving area elements 51 are displaced to a z-position below the table receiving area plane T, wherein, when traversing the table receiving area plane T, the table receiving area elements 31 take up the surface parts of the wafer 2 arranged above the receiving area surfaces of the table receiving area elements.

The aligning means 40 is then displaced further to its vertical resting position $P_{RA}$ (and without being shown in the figures also to its rotational resting position).

This situation is also shown in FIG. 10, wherein the lateral view in this figure shows that now the aligning means 40 and the extraction means 60 are arranged in their entire extension in the z-direction below the z-extension of the wafer table and the table receiving area plane T.

Therefore—as shown in FIG. 11—the wafer table 20 can be displaced in the y-direction in a direction towards an inspection position 8 of the wafer inspection apparatus 9 without colliding with the aligning means 40 or the extraction means 60. This step is realized by means of a y-transport device of the wafer transport system 100 (not shown in FIG. 11).

Just as the y-transport device for the wafer table, the x-transport device and the z-transport device of the extraction means and the z-transport device and the z-rotation device of the aligning means 40 are not shown in FIGS. 1 to 11. Preferably, these transport devices are adapted as electric motors, in particular as linear motors or rotary machines, or respectively comprise at least one of these elements.

The control device (not shown) is adapted for analyzing and evaluating measurement data from the aligning sensor device 80 and it is also adapted for controlling and actuating the electric motors described in the preceding paragraphs, in particular depending on those measurement data.

After the wafer 2 has been inspected, the wafer table is displaced in the y-direction back to the y-position of origin. There, the wafer is transferred from the table receiving area 30 to the extraction receiving area 70 by raising the extraction means 60 in the z-direction; it is raised above the z-extension of the wafer table and is then transported in the x-direction back to a wafer store, in particular to the original wafer store or to another wafer store.

Applications are also envisaged, where after the inspection the wafer 2 is aligned by means of the aligning means 40 into its original rotational angular position α or into any other rotational angular position predetermined depending on the application, before it is placed inside a wafer store by the extraction receiving area 70 or is transferred to another device, depending on the application.

LIST OF REFERENCE NUMERALS 1 wafer aligning device
2 wafer
3 wafer surface
4 edge feature (e.g. notch)
20 wafer table
21 recess
22 limit
30 table receiving area
31 table receiving area element
40 aligning means
41 aligning displacement element
42 aligning support
43 rotary basis
50 aligning receiving area
51 aligning receiving area element
53 aligning ring
54 ring recess
55 receiving area element recess
$P_A$ aligning position
$P_{RA}$ resting position
60 extraction means
61 extraction displacement element
62 vertical extraction support
63 horizontal extraction support
70 extraction receiving area
$P_U$ transfer position
$P_{RU}$ resting position
80 aligning sensor device
81 light curtain
100 wafer transport system
T table receiving area plane
X first direction
Y second direction
α rotational angular position
$α_s$ predetermined rotational angular position

What is claimed is:

1. A wafer aligning device for placing a wafer in a predetermined rotational angular position ($α_S$), the wafer aligning device comprising:
   a wafer table having a table receiving area configured to receive the wafer at the predetermined rotational angular position ($α_S$); and
   an aligning mechanism having an aligning receiving area configured to align the wafer into the predetermined rotational angular position ($α_S$),
   wherein the aligning receiving area is configured in an aligning position ($P_A$) when receiving the wafer such that the aligning receiving area is positioned above the wafer table,
   wherein the aligning mechanism is configured to place the wafer received in the aligning receiving area on the table receiving area of the wafer table by traversing toward the table receiving area via a vertical downward movement, and
   wherein the aligning mechanism is configured to simultaneously align the wafer to the predetermined rotational angular position while traversing toward the table receiving area via the vertical downward movement.

2. The wafer aligning device of claim 1, wherein the wafer table comprises a recess through which the aligning receiving area can be displaced during the vertical downward movement.

3. The wafer aligning device of claim 2, wherein at least one table receiving area element radially engages a vertical projection of the wafer surface when the wafer is placed on the table receiving area.

4. The wafer aligning device of claim 2, further comprising an alignment sensor configured to detect a rotational angular position (a) of the wafer during placement in the aligning receiving area.

5. The wafer aligning device of claim 4, wherein said alignment sensor comprises at least one of a camera and a light curtain for optical detection of surface or edge features of the wafer, and wherein the aligning receiving area is adapted for a rotary alignment of the wafer as a function of a difference determined between the predetermined rotational angular position ($α_S$) and a rotational angular position (a) detected by the alignment sensor.

6. A wafer transport system for transporting a wafer, in particular to an inspection position of a wafer inspection apparatus, comprising:
   the wafer aligning device according to claim 1; and
   an extraction mechanism (44) with an extraction receiving area for transporting the wafer from a storage site in a wafer store to the aligning receiving area, wherein the extraction receiving area is arranged prior to a transfer of the wafer in a transfer position (Pu) above the aligning receiving area,
wherein
   at least one of the aligning receiving area and the extraction receiving area is adapted for positioning the wafer received in the extraction receiving area on the aligning receiving area, by a vertical relative movement in relation to the other of aligning receiving area and extraction receiving area during a reversal of the relative vertical positions of the aligning receiving area and the extraction receiving area in relation to one another, and at least one of the extraction receiving area and the aligning receiving area are arranged in their resting position ($R_{RA}$, $P_{RU}$) below the table receiving area plane (T) of the wafer table.

7. The wafer transport system according to claim 6, wherein
the wafer table is configured to be displaced in relation to the extraction mechanism and the aligning mechanism during transport of the wafer towards an inspection position, wherein the extraction mechanism and the aligning mechanism are arranged below the table receiving area plane (T), particularly during transport.

8. The wafer transport system according to claim 6, whose extraction mechanism can, at least with the extraction receiving area be displaceable through a recess in the wafer table.

9. The wafer transport system according to claim 6, wherein, by means of an aligning sensor device of the wafer aligning device, a relative position of the wafer to the table receiving area of the wafer table can be determined, wherein
the extraction mechanism is adapted to even out, by a translational movement in a first direction (x), a relative position of the wafer deviating from a predefined value, in particular zero, in this direction (x), or
the wafer table is adapted to even out, if required, by a translational movement in a second direction (y), orthogonal to the first direction, a position of the wafer deviating from a predefined value, in particular zero, in direction (y).

10. The wafer transport system according to claim 6, wherein the wafer table is translationally fixed in a first direction (x),
the extraction mechanism is translationally fixed in a second direction (y) orthogonal to the first direction, or
the extraction mechanism is translationally fixed in the first direction (x) and in the second direction (y).

11. A method for aligning a wafer into a predetermined rotational angular position ($\alpha_S$), wherein
an aligning receiving area of an aligning mechanism is arranged above a table receiving area of a wafer table,
the wafer is received into the aligning receiving area,
the wafer is by means of the aligning mechanism rotationally aligned to a predetermined rotational angular position ($\alpha_S$) in the aligning receiving area, wherein the alignment can be realised based at least in part on measurement values of an aligning sensor device,
at least one of aligning receiving area and table receiving area is displaced vertically in relation to the other of aligning receiving area and table receiving area, so that the aligning receiving area and the table receiving area plane (T) traverse each other, wherein the wafer is placed on the table receiving area,
wherein the aligning mechanism is configured to simultaneously align the wafer to the predetermined rotational angular position ($\alpha_S$) while traversing toward the table receiving area via a vertical downward movement.

12. The method according to claim 11, wherein
the aligning receiving areas is lowered so far below the table receiving area plane (T) that the aligned wafer is transferred from the aligning receiving area to the table receiving area arranged in the table receiving area plane (T) and wherein when the wafer is received in the table receiving area, wherein at least part of the wafer surface is positioned on at least one table receiving area element of a limit of a recess f the wafer table.

13. The method for transporting a wafer in particular to an inspection position of a wafer inspection apparatus, wherein
the wafer is taken from a wafer store by means of an extraction receiving area of an extraction mechanism and is displaced to a transfer position ($P_U$) above a table receiving area and a aligning receiving area,
a vertical relative position of the extraction receiving area and the aligning receiving area to one another is modified so, in particular reversed, that the wafer is received in the aligning receiving area from the extraction receiving area above the table receiving area, and wherein
the wafer is aligned according to a method according to claim 11, received in the table receiving area and displaced to the inspection position of the wafer inspection apparatus.

14. The method according to claim 13, wherein
a position of the wafer taken from the wafer store on the extraction mechanism in relation to a first horizontal direction (x) is determined by an aligning sensor device, and
depending on the determined position of the wafer in this direction (x), the extraction mechanism is moved translationally in such a way that the wafer is transferred to the table receiving area at the position in the first direction (x), predetermined by guiding the wafer table in relation to a second direction (y) which is orthogonal to the first direction, in particular via the aligning mechanism.

15. The method according to claim 14, wherein
by means of an aligning sensor device, a position of the wafer taken from the wafer store on the extraction mechanism in the second direction (y) is determined, and
depending on the determined position of the wafer in this direction (y), the wafer table is moved translationally in such a way that the wafer is transferred to the table receiving area at the position determined in relation to the second direction (y), in particular via the aligning mechanism.

* * * * *